United States Patent
Lai et al.

(10) Patent No.: US 8,853,060 B1
(45) Date of Patent: Oct. 7, 2014

(54) EPITAXIAL PROCESS

(71) Applicant: United Microelectronics Corp., Hsin-Chu (TW)

(72) Inventors: Szu-Hao Lai, Kaohsiung (TW); Chun-Yuan Wu, Yun-Lin County (TW); Chin-Cheng Chien, Tainan (TW); Tien-Wei Yu, Kaohsiung (TW); Ming-Hua Chang, Tainan (TW); Yu-Shu Lin, Pingtung County (TW); Tsai-Yu Wen, Tainan (TW); Hsin-Kuo Hsu, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 24 days.

(21) Appl. No.: 13/902,862

(22) Filed: May 27, 2013

(51) Int. Cl.
*H01L 21/20* (2006.01)
*H01L 21/02* (2006.01)

(52) U.S. Cl.
CPC .............. *H01L 21/02634* (2013.01);
*H01L 21/02532* (2013.01)
USPC ........................................ 438/478

(58) Field of Classification Search
None
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,274,894 B1 * | 8/2001 | Wieczorek et al. ........... 257/192 |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |

(Continued)

*Primary Examiner* — Scott B Geyer
(74) *Attorney, Agent, or Firm* — Winston Hsu; Scott Margo

(57) ABSTRACT

An epitaxial process includes the following step. A recess is formed in a substrate. A seeding layer is formed to cover a surface of the recess. A buffer layer is formed on the seeding layer. An etching process is performed on the buffer layer to homogenize and shape the buffer layer. An epitaxial layer is formed on the homogenized flat bottom shape buffer layer.

19 Claims, 4 Drawing Sheets

(56) References Cited

U.S. PATENT DOCUMENTS

| | | |
|---|---|---|
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,682,940 B2 | 3/2010 | Ye |
| 7,691,752 B2 | 4/2010 | Ranade |
| 7,838,370 B2 | 11/2010 | Mehta |
| 8,367,528 B2 * | 2/2013 | Bauer et al. ............... 438/507 |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0075029 A1 * | 3/2009 | Thomas et al. ............... 428/173 |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0093147 A1 | 4/2010 | Liao |
| 2011/0117732 A1 * | 5/2011 | Bauer et al. ............... 438/507 |
| 2011/0212604 A1 * | 9/2011 | Yang et al. ............... 438/478 |
| 2011/0278651 A1 * | 11/2011 | Thirupapuliyur et al. .... 257/288 |
| 2012/0138897 A1 * | 6/2012 | Lin et al. ............... 257/19 |
| 2012/0295427 A1 * | 11/2012 | Bauer ............... 438/494 |
| 2013/0105861 A1 * | 5/2013 | Liao et al. ............... 257/192 |

* cited by examiner

EPITAXIAL PROCESS

BACKGROUND OF THE INVENTION

1. Field of the Invention

The present invention relates generally to an epitaxial process, and more specifically to an epitaxial process, wherein a homogenized buffer layer with a flat bottom shape was formed below an epitaxial layer.

2. Description of the Prior Art

For decades, chip manufacturers have made metal-oxide-semiconductor (MOS) transistors faster by making them smaller. As the semiconductor processes advance to very deep sub micron era such as 65-nm node or beyond, how to increase the driving current for MOS transistors has become a critical issue. In order to improve the devices performances, crystal strain technology has been developed. Crystal strain technology is becoming more and more attractive as a means for getting better performances in the field of MOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel. In the known arts, attempts have been made to use a strained silicon layer, which was grown epitaxially on a silicon substrate with a silicon germanium (SiGe) structure or a silicon carbide structure disposed therebetween. In this type of MOS transistor, a biaxial tensile strain occurs in the epitaxy silicon layer due to the silicon germanium structure or the silicon carbide structure which has a larger or smaller lattice constant than silicon, thereby altering the band structure, and the carrier mobility increases. This enhances the speed performances of the MOS transistors.

Moreover, the performance of an epitaxial layer is related to its size, ingredients, the distribution of the ingredients and its position, even the relative position to a gate. Improving the performance of an epitaxial layer to enhance the performances or achieve specific electrical requirements for formed semiconductor structure has therefore become an important issue in the industry.

SUMMARY OF THE INVENTION

The present invention provides an epitaxial process, wherein a homogenized flat bottom shape buffer layer was formed in a recess for forming an epitaxial layer to control the volume and the cross-sectional profile of the epitaxial layer formed on the buffer layer.

The present invention provides an epitaxial process including the following steps. A recess is formed in a substrate. A seeding layer is formed to cover a surface of the recess. A buffer layer is formed on the seeding layer. An etching process is performed on the buffer layer for forming a homogenized and shaped buffer layer. The center and edge thickness of the buffer layer is substantially the same after the etching process. An epitaxial layer is formed on the buffer layer.

According to the above, the present invention provides an epitaxial process, which forms a seeding layer, forms a buffer layer, performs an etching process to homogenize the buffer layer to have a flat bottom shape, and then forms an epitaxial layer on the homogenized flat bottom shape buffer layer. In this way, the homogenized flat bottom shape buffer layer is easier for the epitaxial layer to be grown thereon, and defects such as dislocations can be reduced. Moreover, the volume and the cross-sectional profile of the epitaxial layer can be adjusted by controlling the flatness and the remaining thickness of the homogenized and shaped buffer layer, thereby achieving specific electrical requirements with controlled stress caused by followed epitaxy steps. Preferably, the volume of the epitaxial layer can be enlarged by forming a thinner buffer layer through etching and shaping, thereby increasing the stresses induced by the epitaxial layer. Therefore, the stress effect induced by the epitaxial layer can be enhanced by the method of forming the homogenized flat bottom shape buffer layer of the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
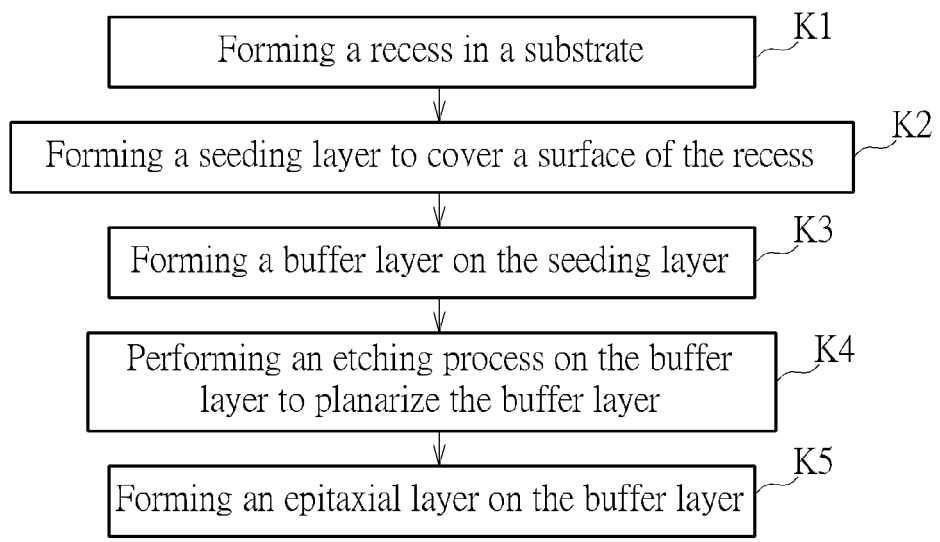
FIG. 1 schematically depicts a flow chart of an epitaxial process according to an embodiment of the present invention.

FIG. 1 schematically depicts a flow chart of an epitaxial process according to an embodiment of the present invention. FIGS. 2-8 schematically depict cross-sectional views of an epitaxial process according to an embodiment of the present invention. Two gates are depicted in this embodiment, which discloses an epitaxial process of the present invention, but the number of the gates is not restricted to it. An epitaxial layer is formed beside the gates in this embodiment, but it is not limited thereto. In this embodiment, germanium (Ge) is implanted/imported to form a silicon germanium (SiGe) layer or a silicon germanium (SiGe) epitaxial layer to form a PMOS transistor, but it is not limited thereto. In another embodiment, other elements may be implanted or imported to form the epitaxial layers; for example, P-type ions such as boron may be implanted or imported to form an epitaxial layer for forming a PMOS transistor, or carbon or N-type ions such as phosphorous may be implanted or imported to form an epitaxial layer for forming a NMOS transistor.

Figure 2:
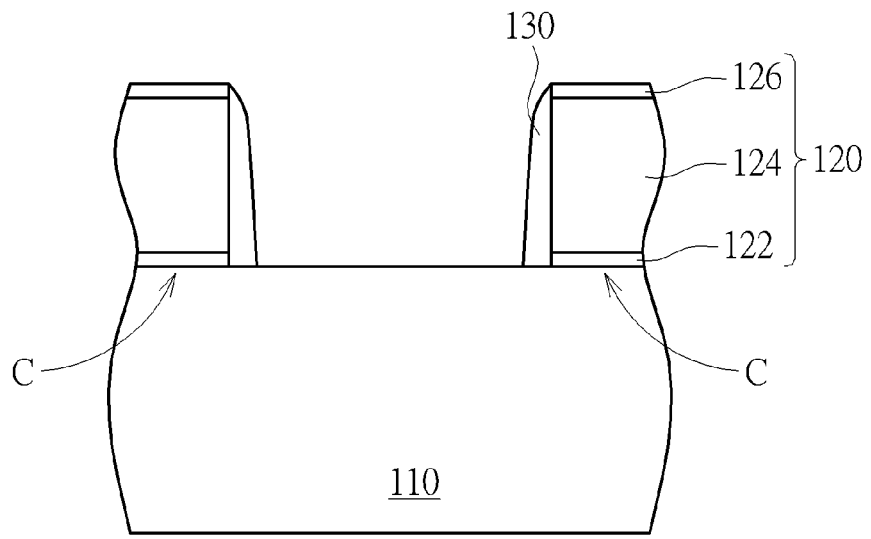
FIGS. 2-8 schematically depicts cross-sectional views of an epitaxial process according to an embodiment of the present invention.
Figure 3:
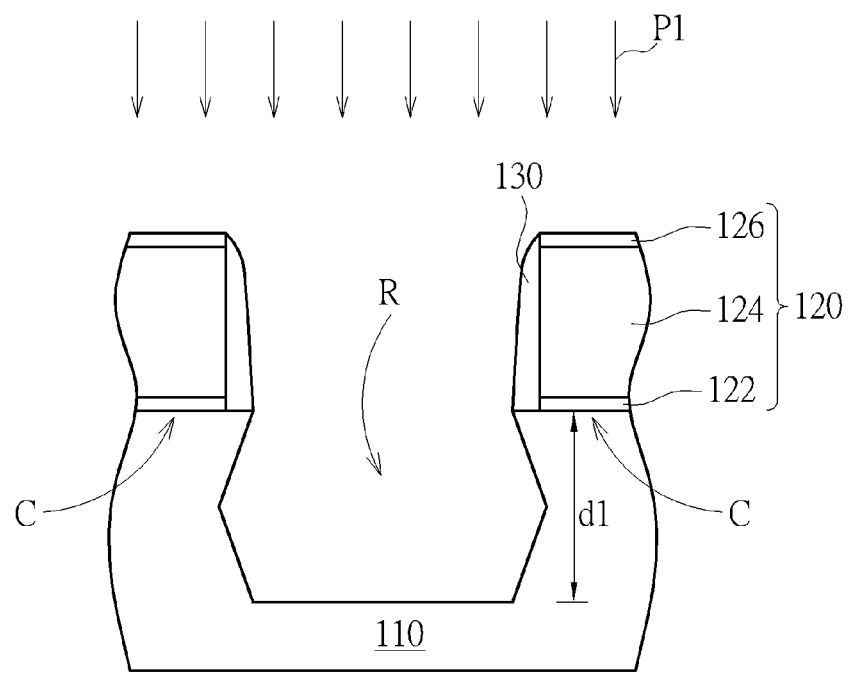

Please refer to FIG. 1 and FIGS. 2-3. According to a step K1 of FIG. 1, a recess is formed in a substrate. More precisely, as shown in FIG. 2, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate.

A plurality of gates 120, such as two gates 120, is formed on the substrate 110. The gates 120 may include a dielectric layer 122, an electrode layer 124 and a cap 126. The dielectric layer 122 may be a buffer layer on and a dielectric layer having a high dielectric constant etc, depending upon the paired semiconductor process. For example, when the present invention is applied in a polysilicon gate process, the dielectric layer 122 is a dielectric suitable for a polysilicon gate such as an oxide layer; when the present invention is applied in a gate-first process or a gate-last for high-K first process, the dielectric layer 122 may include a buffer layer and a dielectric layer having a high dielectric constant; when the present invention is applied in a gate-last for high-K last with a buffer layer first process, the dielectric layer 122 may include a buffer layer and a sacrificial dielectric layer, wherein the sacrificial dielectric layer will be replaced by a dielectric layer having a high dielectric constant in a later performed metal gate replacement process; when the present invention is applied in a gate-last for high-K last with a buffer layer last process, the dielectric layer 122 may be a sacrificial dielectric layer, wherein the sacrificial dielectric layer will be replaced by a buffer layer and a dielectric layer having a high dielectric constant in a later performed metal gate replacement process. In this embodiment, the present invention is applied in a gate-last for high-K first process, and the dielectric layer 122 may include a buffer layer and a dielectric layer having a high dielectric constant. The buffer layer may be an oxide layer, which may be formed through a chemical oxide process, a thermal oxide process, or other processes, for buffering the dielectric layer having a high dielectric constant and the substrate 110. The dielectric layer having a high dielectric constant may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). The electrode layer 124 may be a polysilicon layer to serve as a sacrificial gate, which is replaced by a metal gate through performing a replacement metal gate (RMG) process. The cap layer 126 may be a single layer or multilayer structure composed of nitride or oxide etc.

Two spacers 130 are formed on the substrate 110 beside the gates 120 respectively to define the position of a later formed epitaxial layer in the substrate 110 beside the gates 120, wherein the relative position between the epitaxial layer and the gates 120 will directly affect the stresses induced by the epitaxial layer in a gate channel C below each of the gates 120. The spacers 130 may be single layer or dual layers structures composed of an oxide layer, a nitride layer or an oxynitride layer etc. For simplifying the illustration, the spacers 130 are nitride spacers, and other spacers may be formed before or after the spacers 130 are formed. For instance, a spacer (not shown) may be formed before the spacers 130 are formed to define the position of a lightly doped source/drain (not shown) desired to be formed in the substrate 110 beside the gate 120; or a spacer (not shown) may be formed after the spacers 130 are formed to define the position of a source/drain (not shown) desired to be formed in the substrate 110 beside the gate 120. The formation sequence order of the spacers 130 and other spacers may be changed, and each of these spacers may be partially removed or completely removed after the corresponding epitaxial layer, lightly doped source/drain or source/drain is formed, depending upon a desired formed semiconductor structure.

Thereafter, an etching process P1 is performed to form at least a recess R beside each of the gates 120. Preferably, a recess R is respectively formed in the substrate 110 beside two sides of each of the gates 120. As shown in FIG. 2, only one recess R is formed in the substrate 110 beside the two spacers 130 for clarity purposes. The etching process P1 may be a dry etching process or/and a wet etching process. For instance, the etching process P1 may include performing a dry etching process to form the recess R with a predetermined depth dl and then performing a wet etching process to adjust the size and the shape of the recess R. In this embodiment, the recess R has a diamond shaped cross-sectional profile, but it is not limited thereto. In another embodiment, the recess R may have a differently shaped cross-sectional profile such as a U-shaped cross-sectional profile, a hexagonal-shaped cross-sectional profile or an octagonal-shaped cross-sectional profile. The epitaxial process presented in the present invention is suited for being applied to the recess R having various cross-sectional profiles (or a later formed epitaxial layer having various cross-sectional profiles in the recess R).

Figure 4:
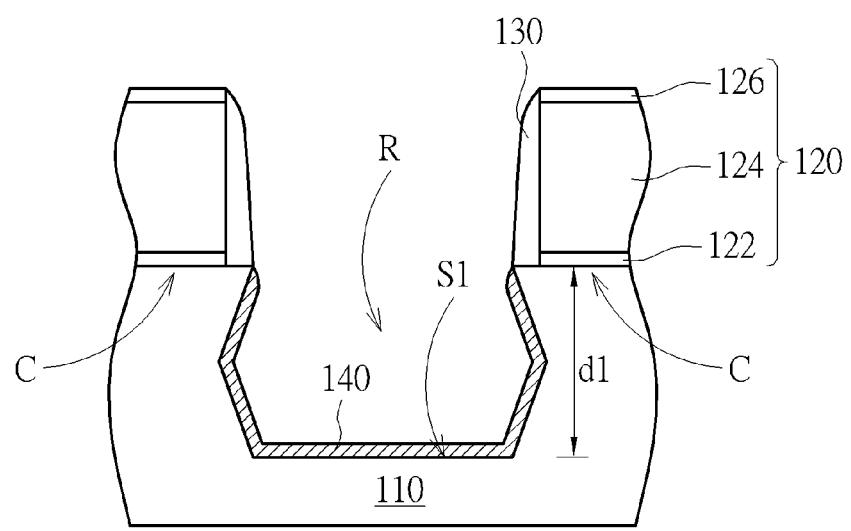

According to a step K2 of FIG. 1, a seeding layer is formed to cover a surface of the recess. As shown in FIG. 4, a seeding layer 140 is formed to cover a surface S1 of the recess R. The seeding layer may be formed through a chemical vapor deposition (CVD) process with silicon containing source gas, but it is not limited thereto. In this embodiment, the method for forming the seeding layer may have only dichlorosilane (DCS) gas imported to form a pure silicon layer on the surface S1 of the recess R, but it is not limited thereto. Moreover, the method for forming the seeding layer may further include importing other gases to form a silicon-containing layer on the surface S1 of the recess R, depending upon the processing needs or a desired formed structure. For example, hydrogen chloride (HCl) gas may be imported to form a silicon layer, wherein the forming ratio of the specific positions can be controlled by adjusting the dichlorosilane (DCS) gas and hydrogen chloride (HCl) gases quantities. In other words, partial areas may be removed by etching when the seeding layer 140 is formed through importing dichlorosilane (DCS) gas and hydrogen chloride (HCl) gas simultaneously. As a result, the seeding layer 140 having a desired profile can be controlled precisely in a macroscopic view.

Figure 5:
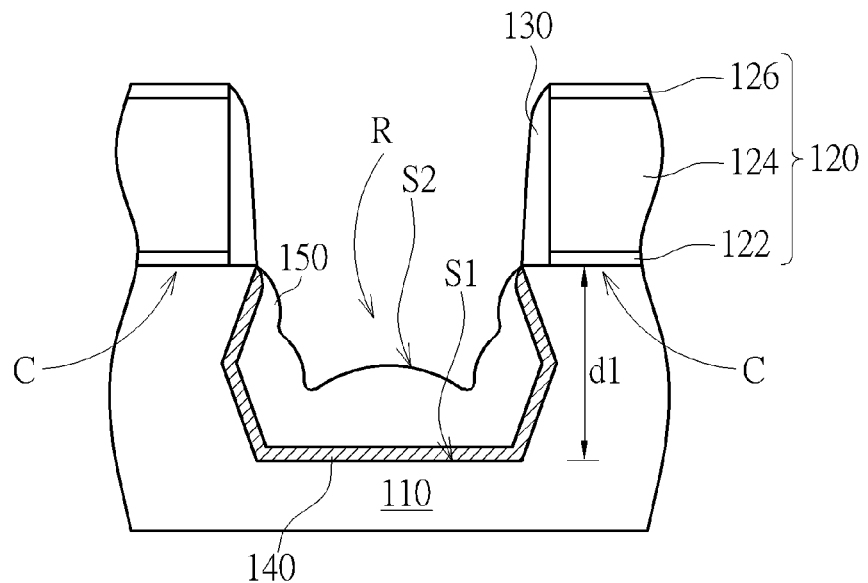

According to a step K3 of FIG. 1, a buffer layer is formed on the seeding layer after the seeding layer 140 is formed. As shown in FIG. 5, a buffer layer 150 is formed on the seeding layer 140. The buffer layer 150 may be a silicon germanium (SiGe) layer with a low germanium concentration for buffering the seeding layer 140 of a pure silicon or a surface of the recess R and a later formed epitaxial layer with a high germanium concentration on the buffer layer 150, thereby reducing the quantity of structural defects such as substrate dislocations caused by the epitaxial layer. Thus, the seeding layer 140 and the buffer layer 150 may include different materials, or the same materials with different concentrations. Preferably, the germanium (Ge) content of the buffer layer 150 is lower than 50%. Still preferably, the germanium (Ge) content of the buffer layer 150 has a gradient distribution with a concentration increasing from the outer side (which substantially contacts the seeding layer 140) toward the inner side. The seeding layer 150 may be a chemical vapor deposition (CVD) process with silicon source gas, but it is not limited thereto. For instance, the seeding layer 150 may have hydrogen chloride (HCl), dichlorosilane (DCS) and germanium (Ge) gases imported, wherein germanium (Ge) gas may be germane (GeH$_4$) gas, but it is not limited thereto. For example, under a pressure of 10 torrs, dichlorosilane (DCS) gas maybe imported at 50 sccm (Standard Cubic Centimeter per Minute) and germanium (Ge) gas maybe imported at 250 sccm, or germanium (Ge) gas maybe imported at 70~380 sccm instead. Furthermore, hydrogen chloride (HCl) gas may be further imported to remove some areas by etching under the same deposition circumstance. Thus, in a macroscopic view, the buffer layer 150 can be formed at specific positions.

The buffer layer 150 may selectively have boron implanted. One of the purposes of the buffer layer 150 is to prevent boron in a boron-containing epitaxial layer formed thereon from diffusing outward to the substrate 110, and this purpose can be achieved by adjusting the boron content in the buffer layer 150 or even without boron in the buffer layer 150. It is emphasized that the buffer layer 150 at this time has a non-homogeneous and rough surface S2. If an epitaxial layer is directly formed on the buffer layer 150, structural defects in the epitaxial layer will occur and the volume and the cross-sectional profile of the epitaxial layer will be hard to control, thereby degrading the overall device performances.

Figure 6:
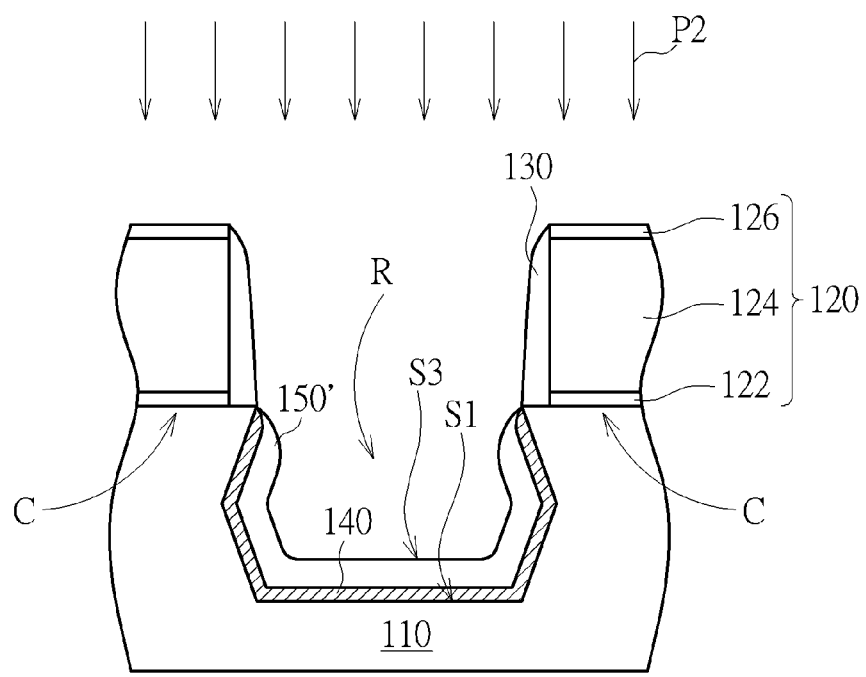

Therefore, according to a step K4 of FIG. 1, an etching process is performed on the buffer layer to homogenize and shape the surface of the buffer layer. As shown in FIG. 6, an etching process P2 is performed to homogenize and shape buffer layer 150, thereby forming a liner buffer layer 150', which has a homogeneous flat bottom surface S3 with substantially same thickness at recessed bottom center and edge. In this way, the aforesaid problem can be solved, which means that defects of a later formed epitaxial layer on the buffer layer 150' can be reduced and the volume and the cross-sectional profile of the epitaxial layer can be well controlled. Moreover, as a part of (the surface S2 of) the buffer layer 150 is removed and the flat bottom surface S3 is formed, the volume of the epitaxial layer can be enlarged, thereby improving the stress performance induced in the gate channel C.

The etching process P2 may include at least an etching gas imported to etch specific areas or specific crystal planes of the buffer layer 150. In one embodiment, the etching gas may be hydrogen chloride (HCl) gas, which can etch specific crystal planes of the buffer layer 150 to remove non-homogeneous areas, so that the buffer layer 150' can be formed with a flat bottom shape, but it is not limited thereto. Moreover, the etching process P2 may further include having at least a depositing gas imported to compensate areas that were over-etched during the etching process; that is, the etching rates of specific positions can be controlled. The depositing gas may include silane ($SiH_4$), dichlorosilane (DCS) or/and germane ($GeH_4$), but it is not limited thereto. It is emphasized that due to the etching rate of the etching process P2 being larger than the depositing rate of the etching process P2, the characteristic of etching and the buffer layer 150 with a homogenized flat bottom shape can be maintained in a macroscopic view. Moreover, the total flow rate of the etching gas of the etching process P2 may be larger than the total flow rate of the depositing gas of the etching process P2, so that the characteristic of etching and smooth surface can be maintained. For instance, when hydrogen chloride (HCl) gas is imported to serve as an etching gas during the etching process P2, and dichlorosilane (DCS) gas and germane ($GeH_4$) gases are imported to serve as depositing gases during the etching process P2, hydrogen chloride (HCl) gas is preferably imported at 200 sccm, dichlorosilane (DCS) gas is preferably imported at 50 sccm and germane ($GeH_4$) gas is preferably imported at 120 sccm. Therefore, the total flow rate of the etching gas (i.e. hydrogen chloride gas) of the etching process P2 is larger than the total flow rate of the depositing gas (i.e. dichlorosilane and germane gases) of the etching process P2, thereby having suitable etching rates for specific areas, but is it not limited thereto. Moreover, the etching process P2 is preferred to be performed at a low pressure to have different etching rates in different crystal planes, and the homogenization and shaping step of the buffer layer 150 can therefore be controlled precisely and the thickness of the buffer layer 150' can also be controlled. The process pressure can be at 0.1 torrs to 200 torrs. Preferably, the process pressure can be at 1 torrs to 100 torrs, or 5-50 torrs still preferably.

The etching process P2 is preferably performed in-situ, so that oxidation and pollution of the buffer layer 150' and other layers caused by exposing them to the air can be avoided. In other words, the etching process P2 may be performed in the same processing chamber as the one where the seeding layer, the buffer layer and the epitaxial layer are formed. Preferably, the etching process P2 is performed by importing different gases or the same gases with different ratios in the same processing chamber as one where the seeding layer, the buffer layer and the epitaxial layer are formed, depending upon the needs. Thus, the qualities of a formed semiconductor component can be ensured, processes can be simplified and costs can be reduced.

Figure 7:
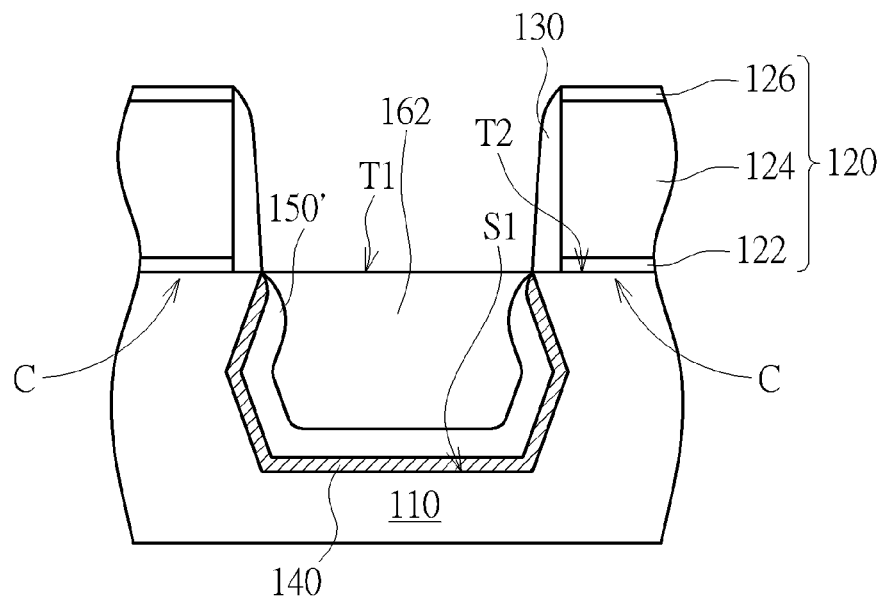
Figure 8:
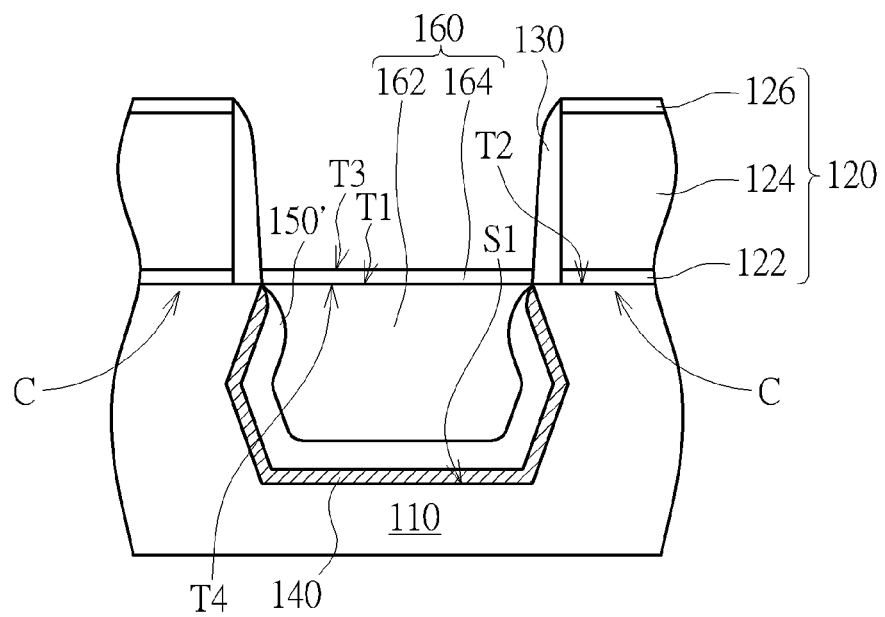

According to a step K5 of FIG. 1, an epitaxial layer is formed on the buffer layer. As shown in FIGS. 7-8, an epitaxial layer 160 is formed on the buffer layer 150'. In an embodiment, the epitaxial layer 160 may include a silicon germanium (SiGe) epitaxial layer, but it is not limited thereto. In this embodiment, the epitaxial layer 160 includes a bulk epitaxial layer 162 and a cap epitaxial layer 164 from bottom to top.

More precisely, as shown in FIG. 7, the bulk epitaxial layer 162 is formed on the buffer layer 150'. At this time, the bulk epitaxial layer 162 fills up the recess R of FIG. 3. Preferably, a top surface T1 of the bulk epitaxial layer 162 is at least on the same level as a top surface T2 of the substrate 110, thereby exerting fully the stress performance of the bulk epitaxial layer 162 and divots on the bulk epitaxial layer 162 will not form, which would lead to coverage difficulty when forming structures thereon. The bulk epitaxial layer 162 may be a silicon germanium (SiGe) epitaxial layer and its germanium (Ge) content is higher than 15% to have a high enough concentration for inducing stresses in the gate channel C because the stresses induced by the epitaxial layer originate mainly from the bulk epitaxial layer 162. The bulk epitaxial layer 162 may be a vapor deposition process, but it is not limited thereto. For instance, dichlorosilane gas at a flow rate of 50 sccm and germane gas at a flow rate of 600 sccm are imported under a pressure of 10 torrs, or germane gas at a flow rate of 380~800 sccm may be imported instead. Moreover, the bulk epitaxial layer 162 may have ions such as boron imported to increase conductivity, such that diborane ($B_2H_6$) at a flow rate of 220 sccm can be imported or diborane ($B_2H_6$) at a flow rate of 70~280 sccm can be imported instead, but it is not limited thereto.

As shown in FIG. 8, the cap epitaxial layer 164 is formed on the bulk epitaxial layer 162. A top surface T3 of the cap epitaxial layer 164 is higher than the top surface T2 of the substrate 110. In this embodiment, the cap epitaxial layer 164 may be a silicon layer to prevent ingredients such as germanium in the bulk epitaxial layer 162 from diffusing outwards. The cap epitaxial layer 164 may be a silicon germanium (Ge) layer with a germanium concentration decreasing from bottom to top. Preferably, the maximum germanium content of the cap epitaxial layer 164 (i.e. the germanium content in a bottom surface T4) is lower than the germanium content of the bulk epitaxial layer 162, and the germanium content in the top surface T3 of the cap epitaxial layer 164 is substantially zero. Furthermore, the cap epitaxial layer 164 may have P-type ions such as boron ions selectively doped to increase conductivity.

Later semiconductor processes such as a source/drain (not shown) implantation process or a salicide process may be performed, which are not described herein. Moreover, implanting source/drain may be performed before the etching process P1 for forming the recess R is performed or at the same time as the bulk epitaxial layer 162 is formed.

To summarize, the present invention provides an epitaxial process, which forms a seeding layer, forms a buffer layer, performs an etching process to homogenize and shape the buffer layer, and then forms an epitaxial layer on the homogenized flat bottom shaped buffer layer. In this way, it is easier for an epitaxial layer to grow on the flat bottom shaped buffer layer, and defects such as dislocations can therefore be reduced. Moreover, the volume and the cross-sectional profile of the epitaxial layer can be adjusted by controlling the flatness and the remaining thickness of the homogenized flat bottom shaped buffer layer, thereby achieving specific electrical requirements. Preferably, the volume of the epitaxial layer can be enlarged by forming a thinner buffer layer through etching and shaping, thereby increasing stresses induced by the epitaxial layer. Therefore, the stress effect induced by the epitaxial layer can be enhanced by the method of forming a homogenized flat bottom shaped buffer layer of the present invention.

Moreover, the etching process of the present invention can etch specific areas or specific crystal planes of the buffer layer, thereby forming the homogenized flat bottom shaped buffer layer. The etching process may include at least an etching gas and at least a selective depositing gas. However, the etching rate of the etching process must be larger than the depositing rate of the etching process to achieve the etching purpose. Intuitively, the total flow rate of the etching gas imported during the etching process is larger than the total flow rate of the depositing gas imported during the etching process to ensure the etching and the shaping characteristics of the etching process. In this way, the purpose of better controlling the etching rates on specific areas can be achieved by importing etching gases and depositing gases simultaneously and by adjusting the compositions and their ratios of these gases; the final thickness at center and edge area of the buffer layer will be substantially the same.

Preferably, the etching process may include importing hydrogen chloride (HCl) gas serving as an etching gas, and selectively further include silane ($SiH_4$), dichlorosilane (DCS) or/and germane ($GeH_4$) gases serving as depositing gases. Moreover, the etching process is performed in the same processing chamber or is performed in-situ when forming the seeding layer, the buffer layer and the epitaxial layer to prevent layers from exposing these layers to the air. Preferably, the etching process is performed by importing different gases or the same gases with different ratios in the same processing chamber as the one for forming the seeding layer, the buffer layer and the epitaxial layer, thereby simplifying the processes and reducing the pollution. In this way, the yields and the quality of a formed semiconductor component are improved.

Moreover, the epitaxial process of the present invention can also be applied in a non-planar MOSFET such as a fin field-effect transistor (FinFET), which includes forming a gate disposed across a fin-shaped structure, forming a recess in the fin-shaped structure by serving the gate and a spacer as a hard mask, forming a seeding layer, forming a buffer layer, performing an etching process to homogenize and shape the buffer layer, and then forming an epitaxial layer on the shaped buffer layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An epitaxial process, comprising:
   forming a recess in a substrate;
   forming a seeding layer to cover a surface of the recess;
   forming a buffer layer on the seeding layer;
   performing an etching process on the buffer layer to homogenize and shape the buffer layer; and
   forming an epitaxial layer on the buffer layer.

2. The epitaxial process according to claim 1, wherein the seeding layer comprises being formed by importing dichlorosilane (DCS) gas.

3. The epitaxial process according to claim 1, wherein the buffer layer comprises being formed by importing hydrogen chloride (HCl), dichlorosilane (DCS), germane ($GeH_4$) gas.

4. The epitaxial process according to claim 1, wherein the etching process comprises importing at least an etching gas.

5. The epitaxial process according to claim 4, wherein the etching gas comprises hydrogen chloride (HCl) gas.

6. The epitaxial process according to claim 4, wherein the etching process comprises importing at least a depositing gas.

7. The epitaxial process according to claim 6, wherein the depositing gas comprises silane ($SiH_4$), dichlorosilane (DCS) or/and germane ($GeH_4$) gas.

8. The epitaxial process according to claim 6, wherein the total flow rate of the etching gas is larger than the total flow rate of the depositing gas.

9. The epitaxial process according to claim 6, wherein the etching rate of the etching process is larger than the depositing rate of the etching process.

10. The epitaxial process according to claim 1, wherein the etching process is performed in-situ.

11. The epitaxial process according to claim 1, wherein the etching process is performed in the same processing chamber as the one where the seeding layer, the buffer layer and the epitaxial layer are formed.

12. The epitaxial process according to claim 11, wherein the etching process is performed by importing different gases from forming the seeding layer, forming the buffer layer and forming the epitaxial layer.

13. The epitaxial process according to claim 1, wherein the epitaxial layer comprises a silicon germanium (SiGe) epitaxial layer.

14. The epitaxial process according to claim 1, wherein the epitaxial layer comprises a bulk epitaxial layer and a cap epitaxial layer from bottom to top.

15. The epitaxial process according to claim 14, wherein the bulk epitaxial layer comprises a silicon germanium (SiGe) epitaxial layer, and the germanium (Ge) content is higher than 15%.

16. The epitaxial process according to claim 1, wherein the seeding layer and the buffer layer comprise different materials.

17. The epitaxial process according to claim 1, wherein the seeding layer comprises a silicon layer.

18. The epitaxial process according to claim 1, wherein the buffer layer comprises a silicon germanium (SiGe) layer.

19. The epitaxial process according to claim 18, wherein the germanium (Ge) content of the buffer layer is lower than 50%.

* * * * *